(12) United States Patent
Cheng et al.

(10) Patent No.: US 10,205,024 B2
(45) Date of Patent: Feb. 12, 2019

(54) SEMICONDUCTOR STRUCTURE HAVING FIELD PLATE AND ASSOCIATED FABRICATING METHOD

(71) Applicant: TAIWAN SEMICONDUCTOR MANUFACTURING COMPANY LTD., Hsinchu (TW)

(72) Inventors: Chih-Chang Cheng, Hsinchu (TW); Fu-Yu Chu, Hsinchu (TW); Ruey-Hsin Liu, Hsinchu (TW); Kuang-Hsin Chen, Jung-Li (TW); Chih-Hsin Ko, Kaohsiung County (TW); Shih-Fen Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 10 days.

(21) Appl. No.: 15/017,225

(22) Filed: Feb. 5, 2016

(65) Prior Publication Data

US 2017/0229570 A1    Aug. 10, 2017

(51) Int. Cl.
| | |
|---|---|
| *H01L 29/78* | (2006.01) |
| *H01L 29/66* | (2006.01) |
| *H01L 29/06* | (2006.01) |
| *H01L 29/40* | (2006.01) |
| *H01L 29/417* | (2006.01) |

(52) U.S. Cl.
CPC ........ *H01L 29/785* (2013.01); *H01L 29/0649* (2013.01); *H01L 29/402* (2013.01); *H01L 29/6681* (2013.01); *H01L 29/7816* (2013.01); *H01L 29/40* (2013.01); *H01L 29/404* (2013.01); *H01L 29/405* (2013.01); *H01L 29/407* (2013.01); *H01L 29/4175* (2013.01); *H01L 29/66659* (2013.01); *H01L 29/66681* (2013.01)

(58) Field of Classification Search
CPC ..... H01L 29/40; H01L 29/402; H01L 29/407; H01L 29/785; H01L 29/7816; H01L 29/66659; H01L 29/66681; H01L 29/4175; H01L 29/405
See application file for complete search history.

(56) References Cited

U.S. PATENT DOCUMENTS

| | | | | |
|---|---|---|---|---|
| 6,031,266 A | * | 2/2000 | Honna | H01L 21/76838 257/336 |
| 6,664,593 B2 | * | 12/2003 | Peake | H01L 29/402 257/335 |
| 6,822,296 B2 | * | 11/2004 | Wang | H02J 7/0026 257/355 |
| 8,664,718 B2 | | 3/2014 | Cheng et al. | |
| 9,373,712 B2 | * | 6/2016 | Wang | H01L 29/402 |

(Continued)

*Primary Examiner* — Mohsen Ahmadi
(74) *Attorney, Agent, or Firm* — WPAT, P.C. Intellectual Property Attorneys; Anthony King

(57) ABSTRACT

A semiconductor structure is disclosed. The semiconductor structure includes: a substrate; a gate structure formed over the substrate; a source region and a drain region formed in the substrate on either side of the gate structure, the source region and the drain region both having a first type of conductivity; and a field plate formed over the substrate between the gate structure and the drain region; wherein the field plate is coupled to the source region or a bulk electrode of the substrate. An associated method for fabricating the semiconductor structure is also disclosed.

20 Claims, 20 Drawing Sheets

(56) References Cited

U.S. PATENT DOCUMENTS

| | | | |
|---|---|---|---|
| 9,391,196 B1* | 7/2016 | Chang | H01L 29/402 |
| 9,559,199 B2* | 1/2017 | Imthurn | H01L 29/402 |
| 2005/0156234 A1* | 7/2005 | Gammel | H01L 29/402 |
| | | | 257/335 |
| 2006/0202299 A1* | 9/2006 | Chertouk | H01L 27/095 |
| | | | 257/500 |
| 2006/0286741 A1* | 12/2006 | Pan | H01L 27/0629 |
| | | | 438/238 |
| 2007/0007591 A1* | 1/2007 | Theeuwen | H01L 29/0847 |
| | | | 257/340 |
| 2008/0014690 A1* | 1/2008 | Chu | H01L 29/66659 |
| | | | 438/197 |
| 2008/0185629 A1* | 8/2008 | Nakano | H01L 27/0207 |
| | | | 257/316 |
| 2008/0237705 A1* | 10/2008 | Theeuwen | H01L 29/41725 |
| | | | 257/343 |
| 2011/0198706 A1* | 8/2011 | Kwak | H01L 27/0207 |
| | | | 257/401 |
| 2012/0098063 A1* | 4/2012 | Tsai | H01L 29/402 |
| | | | 257/339 |
| 2012/0228695 A1* | 9/2012 | Toh | H01L 29/402 |
| | | | 257/328 |
| 2012/0228704 A1* | 9/2012 | Ju | H01L 29/402 |
| | | | 257/339 |
| 2012/0280323 A1* | 11/2012 | Chuang | H01L 27/0266 |
| | | | 257/368 |
| 2013/0161739 A1* | 6/2013 | Tseng | H01L 29/404 |
| | | | 257/336 |
| 2014/0008733 A1* | 1/2014 | Shrivastava | H01L 21/823807 |
| | | | 257/401 |
| 2014/0183518 A1* | 7/2014 | Tsai | H01L 29/78 |
| | | | 257/43 |
| 2014/0239371 A1* | 8/2014 | Tan | H01L 29/792 |
| | | | 257/324 |
| 2015/0123199 A1* | 5/2015 | Chen | H01L 29/66681 |
| | | | 257/339 |
| 2015/0200271 A1* | 7/2015 | Lee | H01L 29/66795 |
| | | | 257/401 |
| 2015/0236150 A1* | 8/2015 | Chen | H01L 29/7816 |
| | | | 327/109 |
| 2016/0093729 A1* | 3/2016 | Wang | H01L 29/402 |
| | | | 257/339 |
| 2016/0149007 A1* | 5/2016 | Chou | H01L 29/402 |
| | | | 257/339 |
| 2016/0284841 A1* | 9/2016 | Min | H01L 29/1033 |
| 2017/0221876 A1* | 8/2017 | Huang | H01L 27/0255 |

* cited by examiner

SEMICONDUCTOR STRUCTURE HAVING FIELD PLATE AND ASSOCIATED FABRICATING METHOD

BACKGROUND

There are a number of challenges in scaling planar metal-oxide-semiconductor field-effect transistors (MOS-FETs). For example, threshold swing degradation, large drain-induced barrier lowering (DIBL), device characteristics fluctuations, and leakage are among the problems to be addressed by 3-D device structures. Fin field-effect transistors (FinFETs) are 3-D device structures that can be used in nano-scale complementary metal-oxide-semiconductor (CMOS) and high-density memory applications. FinFETs with lateral double-diffused MOS (LDMOS) structures can provide a high breakdown voltage (e.g., between drain and source terminals). The high breakdown voltage is achieved, for example, by a charge carrier (e.g., electron) flow path that passes through a depletion region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
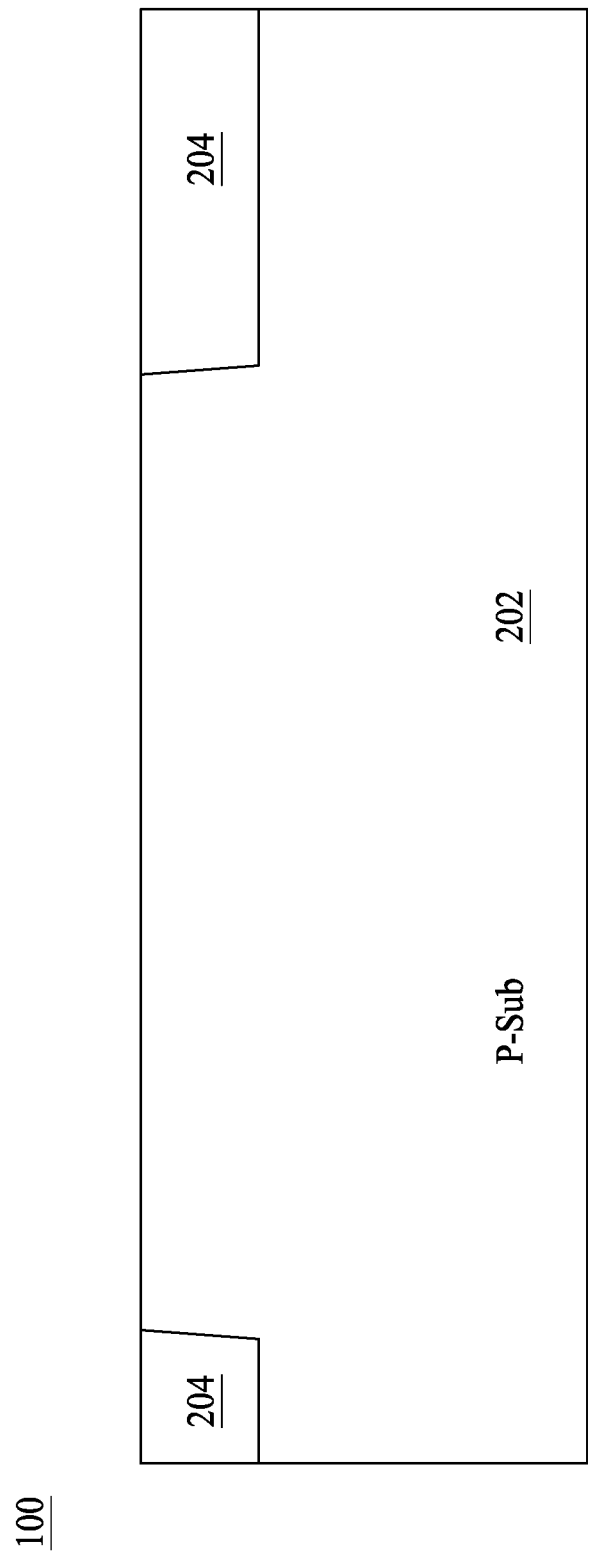
FIGS. 1-8C are cross-sectional diagrams illustrating a high voltage semiconductor device at various stages of fabrication according to an exemplary embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIGS. 1-8 show a series of cross-sectional views illustrating an n-type lateral double-diffused MOS (LDMOS) FinFET device 100 for high-voltage operation at various stages of fabrication according to an exemplary embodiment of the present disclosure. A p-type FinFET may also be manufactured in a similar manner by changing the doping types for the various layers. For each figure, a longitudinal cross-sectional view is depicted. Although these cross-sectional views show various structural features throughout the manufacturing method, it will be appreciated that there are many variations that can be used. The present methodology is merely an example and is not a limitation of the present disclosure.

It is noted that FIGS. 1-8 have been simplified for a better understanding of the disclosed embodiment. Moreover, the high voltage n-type LDMOS FinFET device 100 may be configured as a system-on-chip (SoC) device having various PMOS and NMOS transistors that are fabricated to operate at different voltage levels. The PMOS and NMOS transistors may provide low voltage functionality including logic/memory devices and input/output devices, and high voltage functionality including power management devices. For example, transistors that provide low voltage functionality may have operating (or drain) voltages of 1.1 V with standard CMOS technology, or voltages of 1.8/2.5/3.3 V with special (input/output) transistors in standard CMOS technology. In addition, transistors that provide medium/high voltage functionality may have operating (or drain) voltages of 5 V or greater (e.g., 20-35 V). It is understood that the high voltage n-type LDMOS FinFET device 100 may also include resistors, capacitors, inductors, diodes, and other suitable microelectronic devices that are typically implemented in integrated circuits.

Referring to FIG. 1, a semiconductor substrate 202 is provided. The substrate 202 may include a semiconductor wafer such as a silicon wafer. Alternatively, the substrate 202 may include other elementary semiconductors such as germanium. The substrate 202 may also include a compound semiconductor such as silicon carbide, gallium arsenic, indium arsenide, and indium phosphide. Moreover, the substrate 202 may include an alloy semiconductor such as silicon germanium, silicon germanium carbide, gallium arsenic phosphide, and gallium indium phosphide. In an embodiment, the substrate 202 includes an epitaxial layer (epi layer) overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX). In various embodiments, the substrate 202 may include a buried layer such as an n-type buried layer (NBL), a p-type buried layer (PBL), and/or a buried dielectric layer including a buried oxide (BOX) layer.

In some instances, the semiconductor substrate 202 can also include multiple wafers or dies which are stacked or otherwise adhered together. The semiconductor substrate 202 can include wafers which are cut from a silicon ingot, and/or any other type of semiconductor/non-semiconductor and/or deposited or grown (e.g. epitaxial) layers formed on an underlying substrate. In the present embodiment, as in a high voltage n-type LDMOS FinFET device, the substrate 202 includes a p-type silicon substrate (p-substrate). To form a complementary LDMOS FinFET device, an n-type buried layer, i.e., deep n-well (DNW), may be implanted deeply under the active region of the high voltage p-type LDMOS FinFET device of the p-substrate 202.

Isolation feature structures 204 such as shallow trench isolations (STI) or local oxidation of silicon (LOCOS) including isolation features may be formed in the substrate 202 to define and electrically isolate various active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Figure 2:
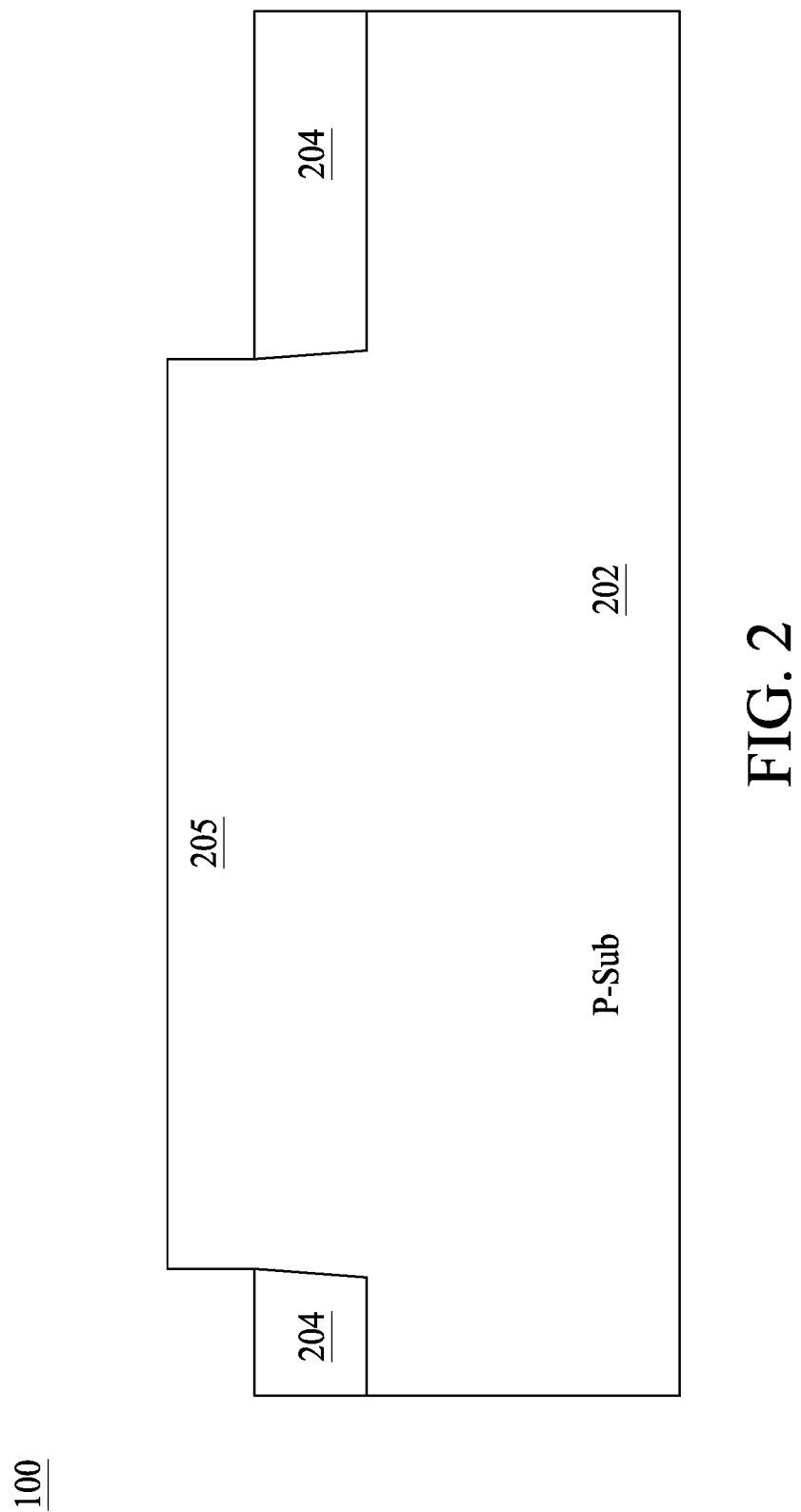

Referring to FIG. 2, a semiconductor fin 205 is formed on the semiconductor substrate 202. The semiconductor fin 205 extends laterally between the isolation feature structures 204.

Figure 3:
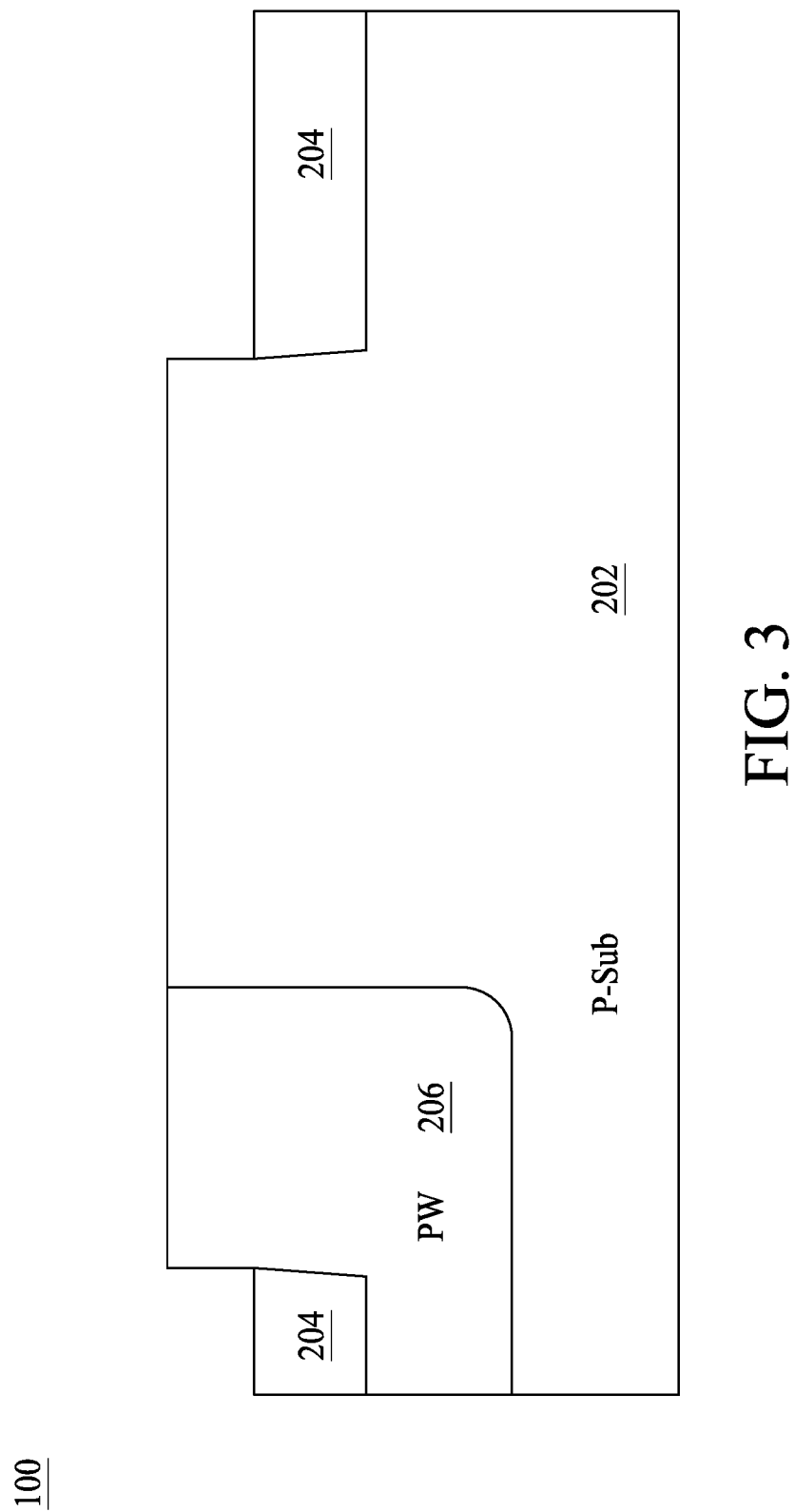

In FIG. 3, a P-well region (PW) 206 is formed in various regions of the P-substrate 202 and the semiconductor fin 205 by ion-implantation or diffusion techniques known in the art. For example, a P-well mask is used to pattern a photoresist layer in a photolithography process or other suitable process in order to cover a first portion of the semiconductor fin 205. An exemplary photolithography process may include processing steps of photoresist coating, soft baking, mask aligning, exposing, post-exposure baking, developing, and hard baking. An ion implantation utilizing a p-type dopant (i.e. a p-type punch-through implantation), such as boron, may be performed to form the P-well (PW) 206 in the substrate 202. In this way, some ions are blocked from entering the fin 205, while other ions scatter off the isolation feature structures 204 and are implanted into the fin 205 under the upper surface of the isolation feature structures 204 to form the P-well region (PW) 206.

Figure 4:
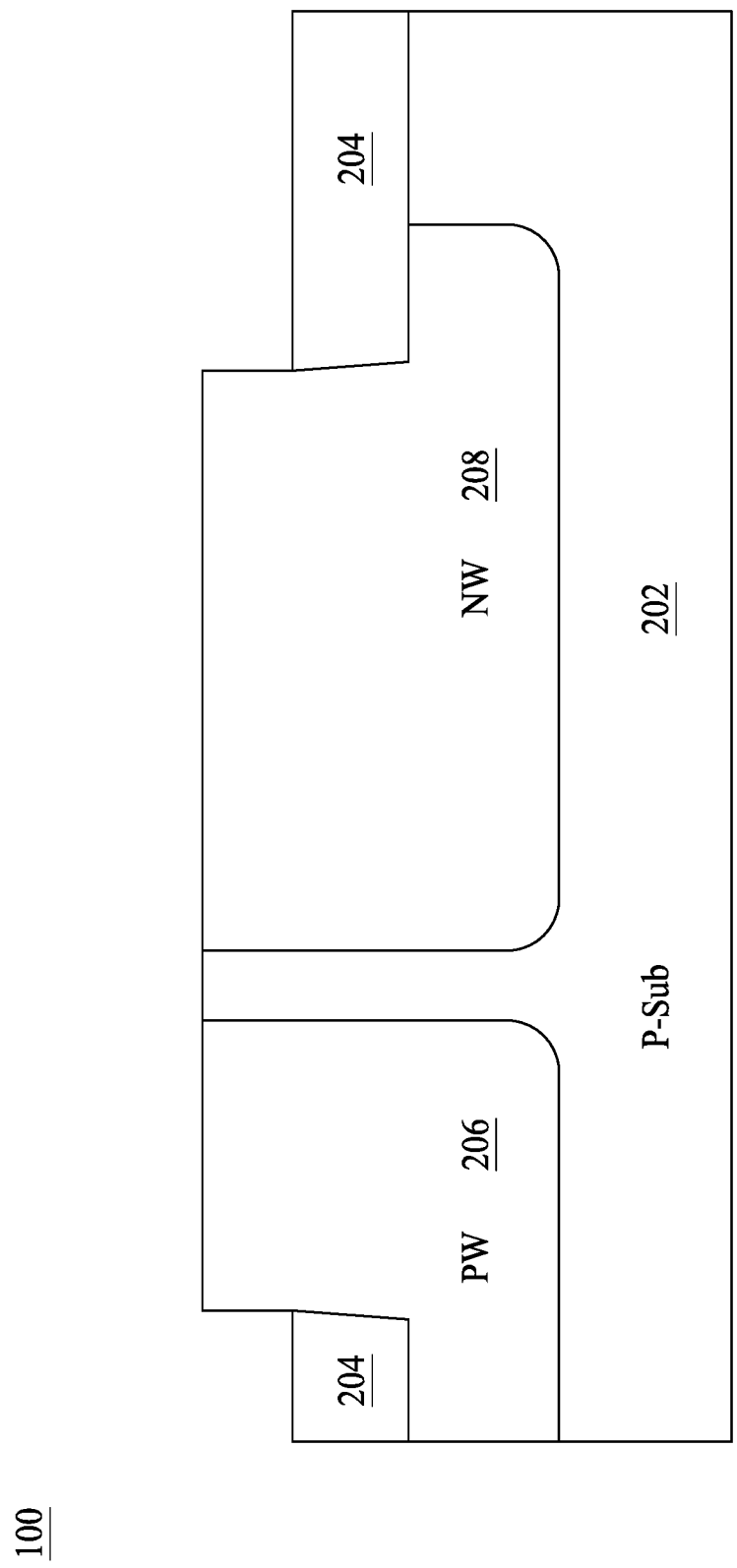

In FIG. 4, an N-well region (NW) 208 is formed in various regions of the P-substrate 202 and the semiconductor fin 205 by ion-implantation or diffusion techniques similar to forming the P-well region 206 mentioned above. For example, an N-well mask is used to pattern a photoresist layer in a photolithography process or other suitable process in order to cover a second portion of the semiconductor fin 205. An exemplary photolithography process may include processing steps of photoresist coating, soft baking, mask aligning, exposing, post-exposure baking, developing, and hard baking. An ion implantation utilizing an n-type dopant, such as arsenic or phosphorus, may be performed to form the N-well (NW) 208 in the substrate 202. In this way, some ions are blocked from entering the fin 205, while other ions scatter off the isolation feature structures 204 and are implanted into the fin 205 under the upper surface of the isolation feature structures 204 to form the N-well region (NW) 208.

Figure 5:
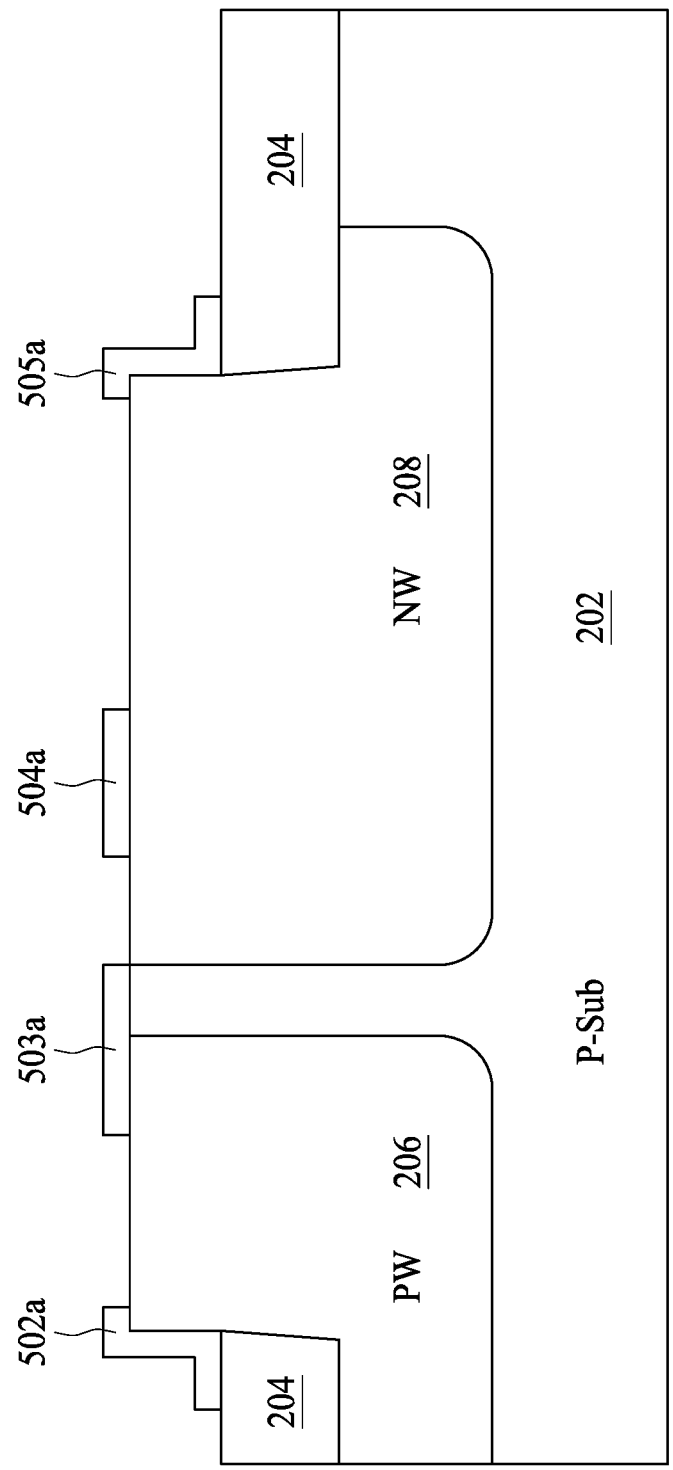

In FIG. 5, gate dielectric layers 502a-505a are formed and patterned on the semiconductor fin 205. The gate dielectric layers 502a-505a may include a silicon oxide layer. Alternatively, the gate dielectric layer 502a-505a may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. Moreover, the gate dielectric layers 502a-505a may have a multilayer structure such as one layer of silicon oxide and another layer of high k material. Furthermore, the gate dielectric layers 502a-505a may be formed using chemical vapor deposition (CVD), physical vapor deposition (PVD), atomic layer deposition (ALD), thermal oxide, other suitable processes, or combinations thereof.

Figure 6:
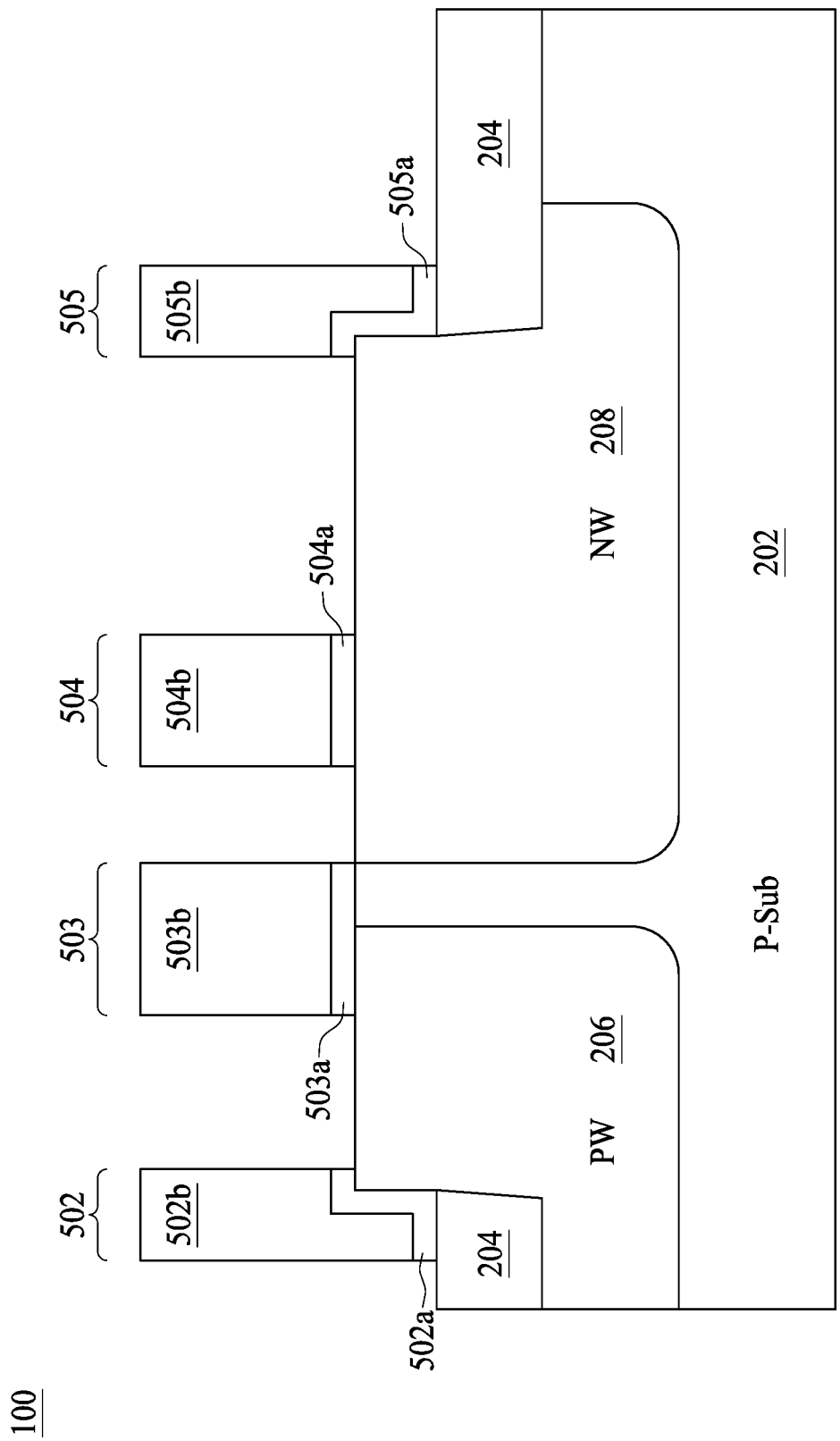

In FIG. 6, gate electrodes 502b-505b are formed on the gate dielectric layers 502a-505a, respectively. The gate electrodes 502b-505b may include a doped polycrystalline silicon (or polysilicon). Alternatively, the gate electrodes 502b-505b may include a metal such as Al, Cu, W, Ti, Ta, TiN, TaN, NiSi, CoSi, other suitable conductive materials, or combinations thereof. In addition, the gate electrodes 502b-505b may be formed by CVD, PVD, plating, and other proper processes. Also, the gate electrodes 502b-505b may have a multilayer structure and may be formed in a multi-step process using a combination of different processes. In the exemplary embodiment, the gate dielectric layer 503a and the gate electrode 503b together form an active gate structure 503 on the semiconductor fin 205.

Similarly, the gate dielectric layer 504a and the gate electrode 504b together form a gate structure 504 on the semiconductor fin 205. In particular, the gate structure 504 may be disposed on the N-well region 208 adjacent to the active gate structure 503, and may be used as a field plate to enhance device breakdown voltage. Details regarding the function of the field plate will be described in the following paragraphs. Further, the gate dielectric layer 502b and the gate electrode 502a together form a gate structure 502 covering a sidewall of the semiconductor fin 205, and the gate dielectric layer 505b and the gate electrode 505a together form a gate structure 505 covering another sidewall of the semiconductor fin 205. The gate structures 502 and 505 are regarded as dummy gate structures and may be comprised of non-metal materials different from the active gate structure 503 and the gate structure 504. In some embodiments, the gate structure 504 may be coplanar with the active gate structure 503 and the dummy gate structures 502 and 505. In some embodiments, the gate structures 502 and 505 may be eliminated.

The gate structures 502-505 may further include sidewall spacers (not shown). The sidewall spacers may be formed on both sides of the gate structures 502-505. The sidewall spacers may include a dielectric material such as silicon oxide. Alternatively, the sidewall spacers may optionally include silicon nitride, silicon carbide, silicon oxynitride, or combinations thereof. In some embodiments, the sidewall spacers may have a multilayer structure. The sidewall spacers may be formed by deposition and etching (anisotropic etching technique) as is known in the art.

Figure 7:
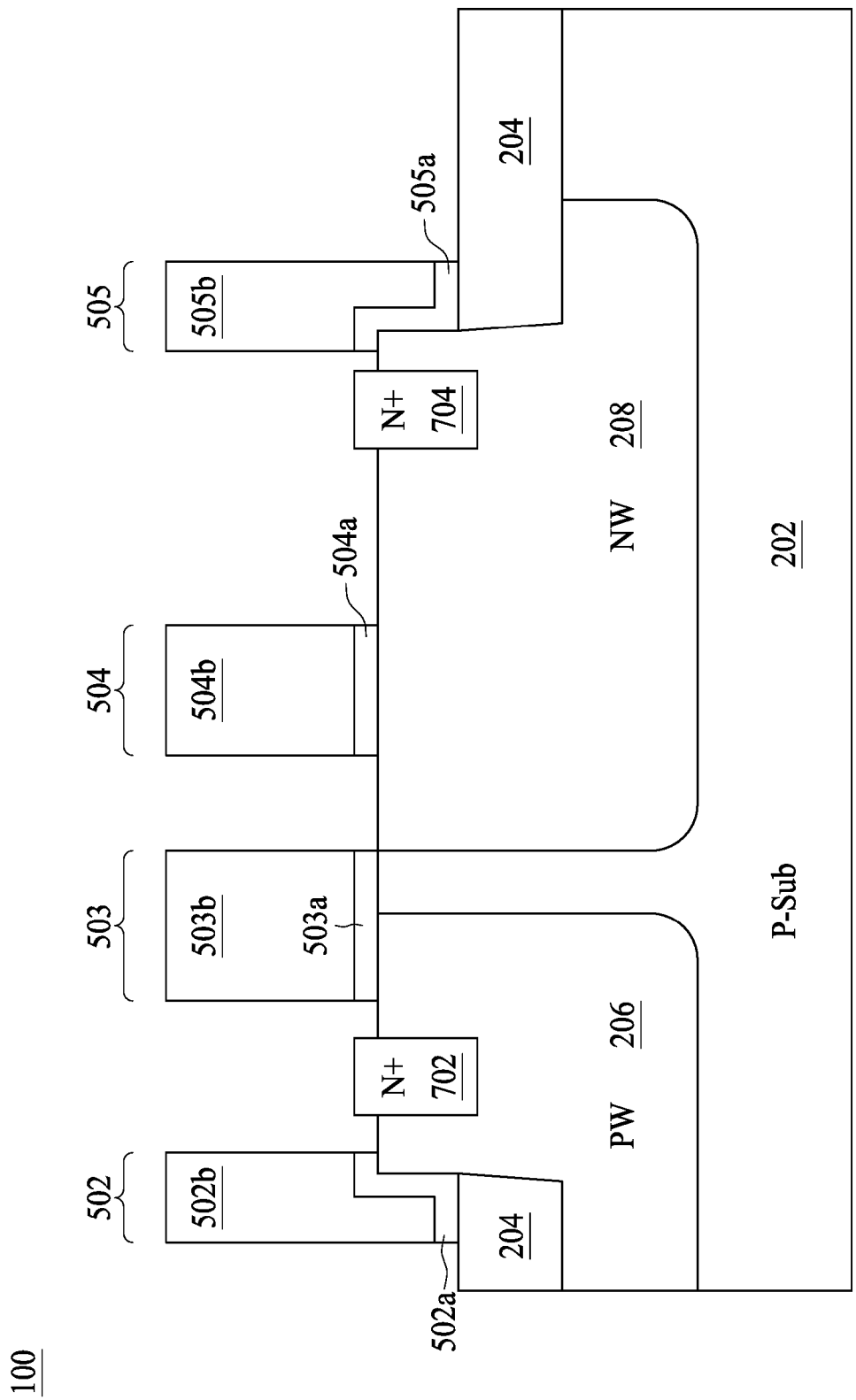

In FIG. 7, a source region 702 is formed in the P-well 206 and a drain region 704 is formed in the N-well 208, where the source region 702 and drain region 704 are n-type (referred to as N+ or heavily doped regions). The n-type source region 702 and the n-type drain region 704 may be positioned on both sides of the active gate structure 503 and interposed thereby. In some embodiments, the source region 702 may include an edge adjacent or substantially self-aligned to one of the sidewall spacers of the active gate structure 503. The drain region 704 may include an edge that is distanced from an outer edge of the other one of the sidewall spacers of the active gate structure 503. In the present embodiment, the source region 702 and the drain region 704 include n-type dopants such as P or As. The source region 702 and the drain region 704 may be formed by a method such as ion implantation or diffusion or deposition. A rapid thermal annealing (RTA) process may be used to activate the implanted dopant. In various embodiments, the source region 702 and the drain region 704 may have different doping profiles formed by a multi-process implantation.

Figure 8A:
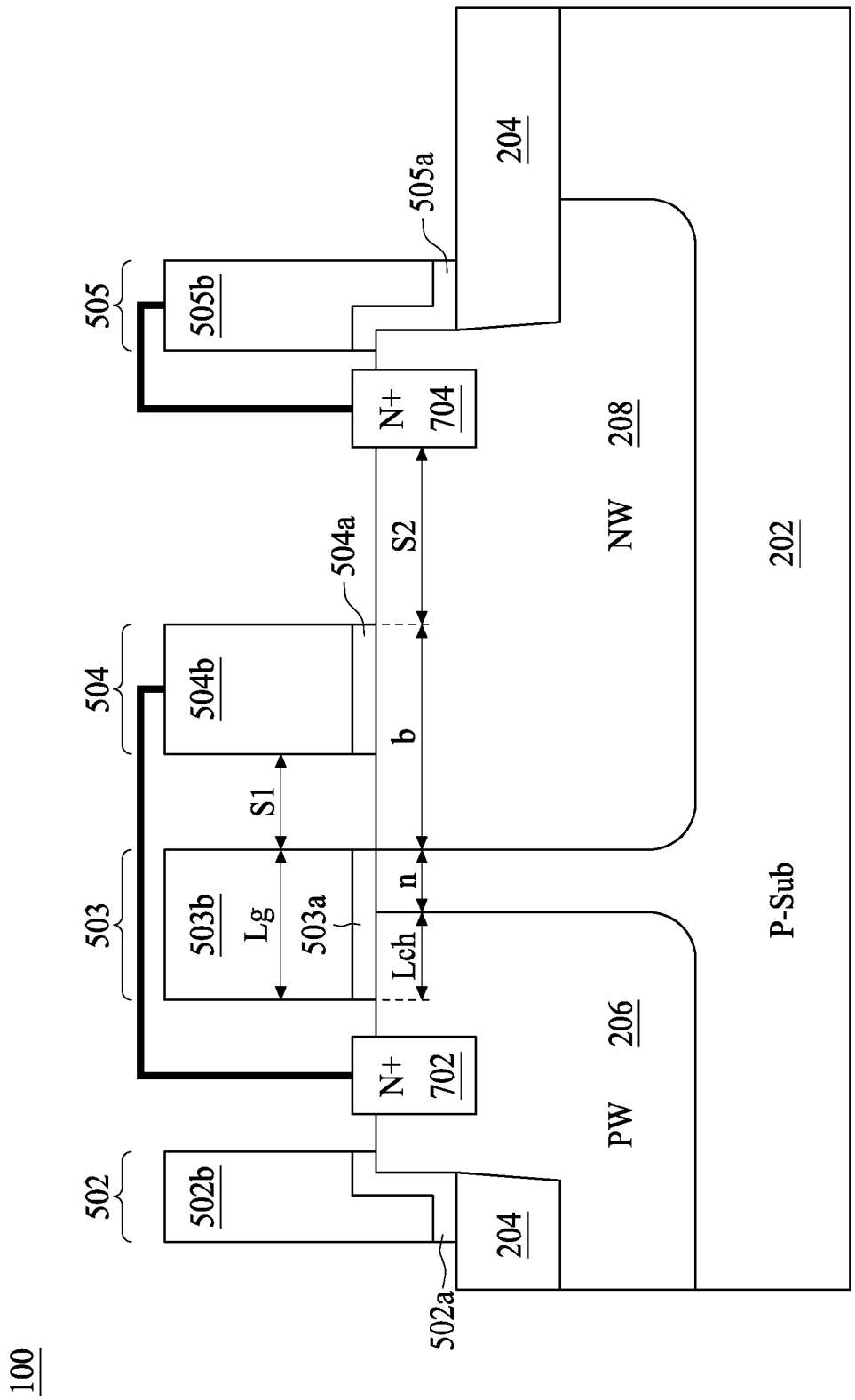
Figure 8B:
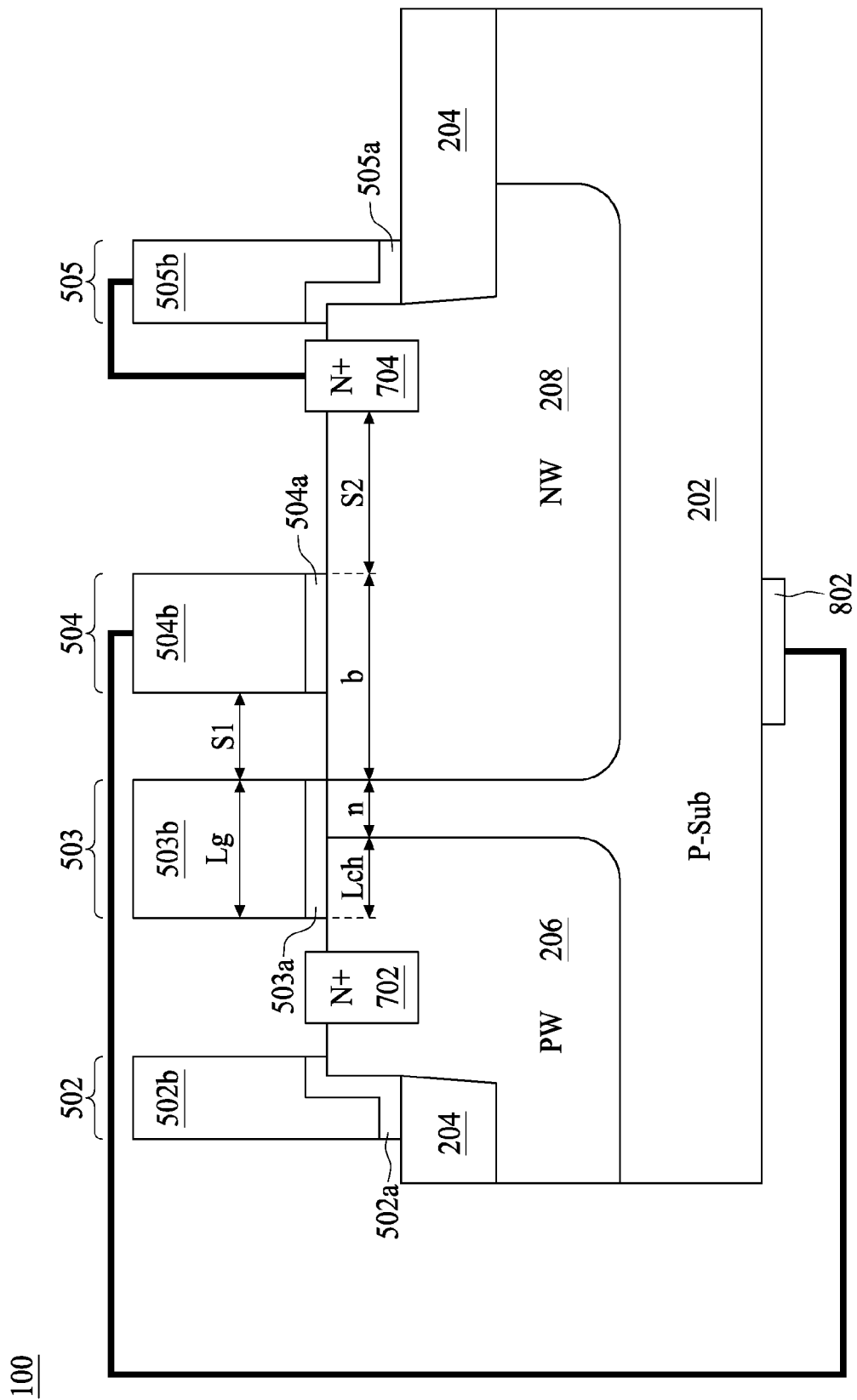

A plurality of patterned dielectric layers and conductive layers may then be formed over the substrate 202 in order to form multilayer interconnects configured to couple the various p-type and n-type doped regions in the substrate 202, such as the source region 702, the drain region 704, and the gate electrode 503b. However, details regarding the multilayer interconnects are not depicted for brevity. The gate structure 504 may be coupled to the source region 702 as can be seen in FIG. 8A, where the connection between the gate structure 504 and the source region 702 is schematically illustrated. In some embodiments, the gate structure 504 may be alternatively coupled to a bulk electrode 802 of the semiconductor substrate 202 as can be seen in FIG. 8B. The configurations of the gate structure 504 of FIGS. 8A and 8B can provide an electric field shielding capability to prevent high electric field induced device damage by the high voltage at the drain region 704. A parasitic capacitance $C_{GD}$ between the active gate structure 503 and the drain region 704 can also be reduced, thereby increasing the operating bandwidth for high-switching frequency applications.

Figure 8C:
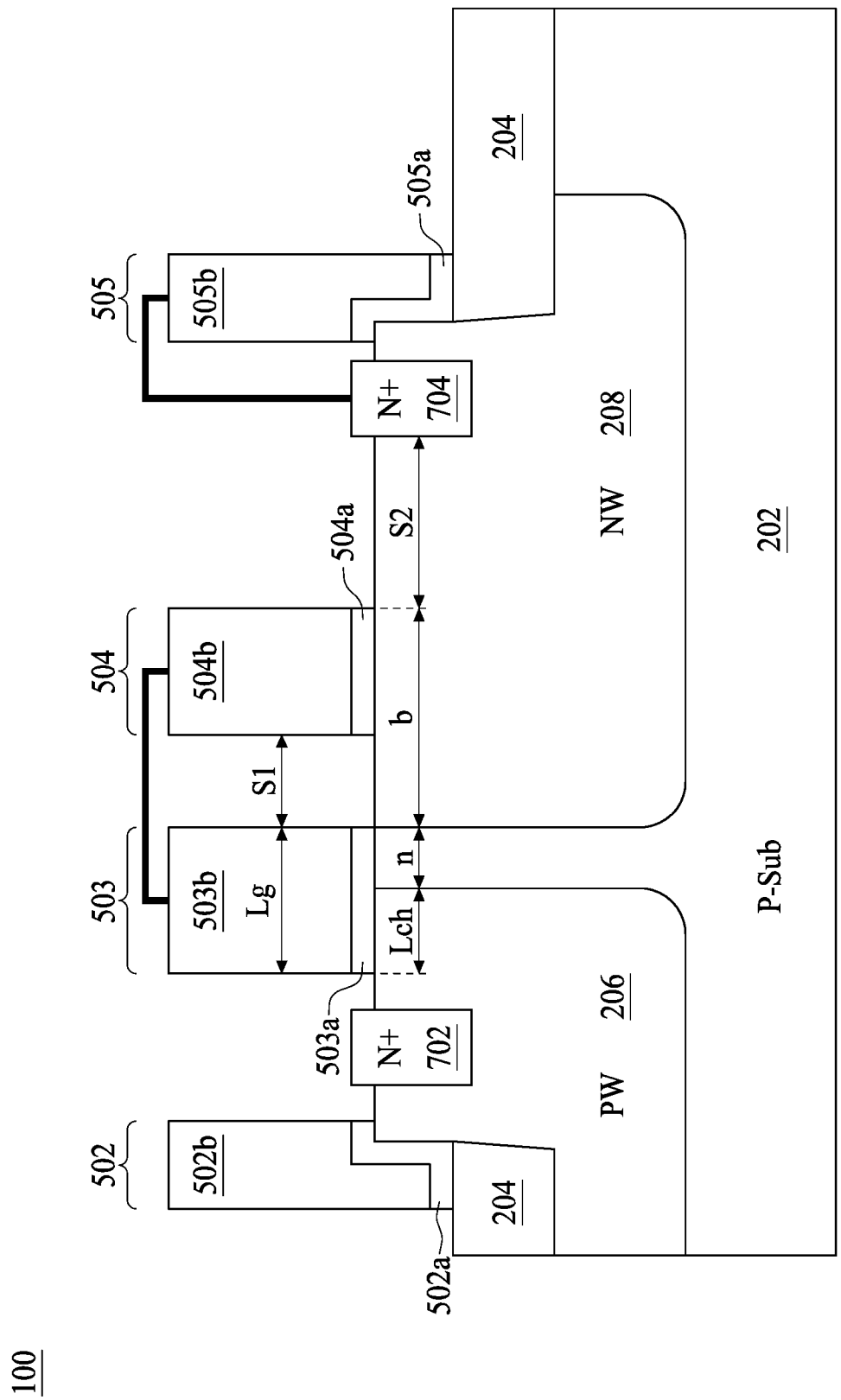

In some embodiments, the gate structure 504 may be coupled to the active gate structure 503 in order to obtain a lower on-resistance $R_{dson}$, as shown in FIG. 8C. The dummy gate structure 505 may be coupled to the drain region 704 and the dummy gate structure 502 may be left floating as shown in FIGS. 8A-8C. However, this is not a limitation of the present disclosure. In some embodiments, the dummy gate structure 505 may be left floating. In some embodiments, the dummy gate structure 502 may be coupled to the source region 702. In some embodiments, the dummy gate structure 502 may be coupled to the bulk electrode 802 of the semiconductor substrate 202.

A distance S1, not zero, between the active gate structure 503 and the gate structure 504 may be as small as possible. For example, the distance S1 may be about 80 nm. However, this is not a limitation of the present disclosure. In some embodiments, the distance S1 may range from about 0 to about 200 nm. In some embodiments, the distance S1 may range from about 0 to about 1 um. In some embodiments, the N-well region 208 may be substantially self-aligned to the active gate structure 503 at one end. However, in some embodiments, the N-well region 208 may at least partially overlap the active gate structure 503 at one end. In some embodiments, a gate length Lg may be greater than or equal to an overlap Lch between the P-well region 206 and the active gate structure 503. For example, the gate length Lg may be about 240 nm, and the overlap Lch may be about 135 nm. Moreover, a distance n between the N-well region 208 and the P-well region 206 may be about 105 nm. However, this is not a limitation of the present disclosure. In some embodiments, the gate length Lg may range from about 1 nm to about 500 nm, and the overlap Lch may range from about 1 nm to about 500 nm. The distance n between the N-well region 208 and the P-well region 206 may range from about 0 to about 500 nm. In some embodiments, a distance b between a left edge of the N-well region 208 and a right edge of the gate structure 504 may be about 200 nm. Furthermore, a distance S2 between the right edge of the gate structure 504 to the drain region 704 may be 200 nm. In some embodiments, the distance b may range from about 1 nm to about 1 um, and the distance S2 may range from about 1 nm to about 1 um.

FIGS. 9-16 show a series of cross-sectional views illustrating an n-type lateral double-diffused MOS (LDMOS) FinFET device 900 for high-voltage operation at various stages of fabrication according to another exemplary embodiment of the present disclosure. A p-type FinFET may also be manufactured in a similar manner by changing the doping types for the various layers. For each figure, a longitudinal cross-sectional view is depicted. Although these cross-sectional views show various structural features throughout the manufacturing method, it will be appreciated that there are many variations that can be used. The present methodology is merely an example and is not a limitation of the present disclosure.

It is noted that FIGS. 9-16 have been simplified for a better understanding of the disclosed embodiment. Moreover, the high voltage n-type LDMOS FinFET device 900 may be configured as a system-on-chip (SoC) device having various PMOS and NMOS transistors that are fabricated to operate at different voltage levels. The PMOS and NMOS transistors may provide low voltage functionality including logic/memory devices and input/output devices, and high voltage functionality including power management devices. For example, transistors that provide low voltage functionality may have operating (or drain) voltages of 1.1 V with standard CMOS technology, or voltages of 1.8/2.5/3.3 V with special (input/output) transistors in standard CMOS technology. In addition, transistors that provide medium/high voltage functionality may have operating (or drain) voltages of 5 V or greater (e.g., 20-35 V). It is understood that the high voltage n-type LDMOS FinFET device 100 may also include resistors, capacitors, inductors, diodes, and other suitable microelectronic devices that are typically implemented in integrated circuits.

Figure 9:
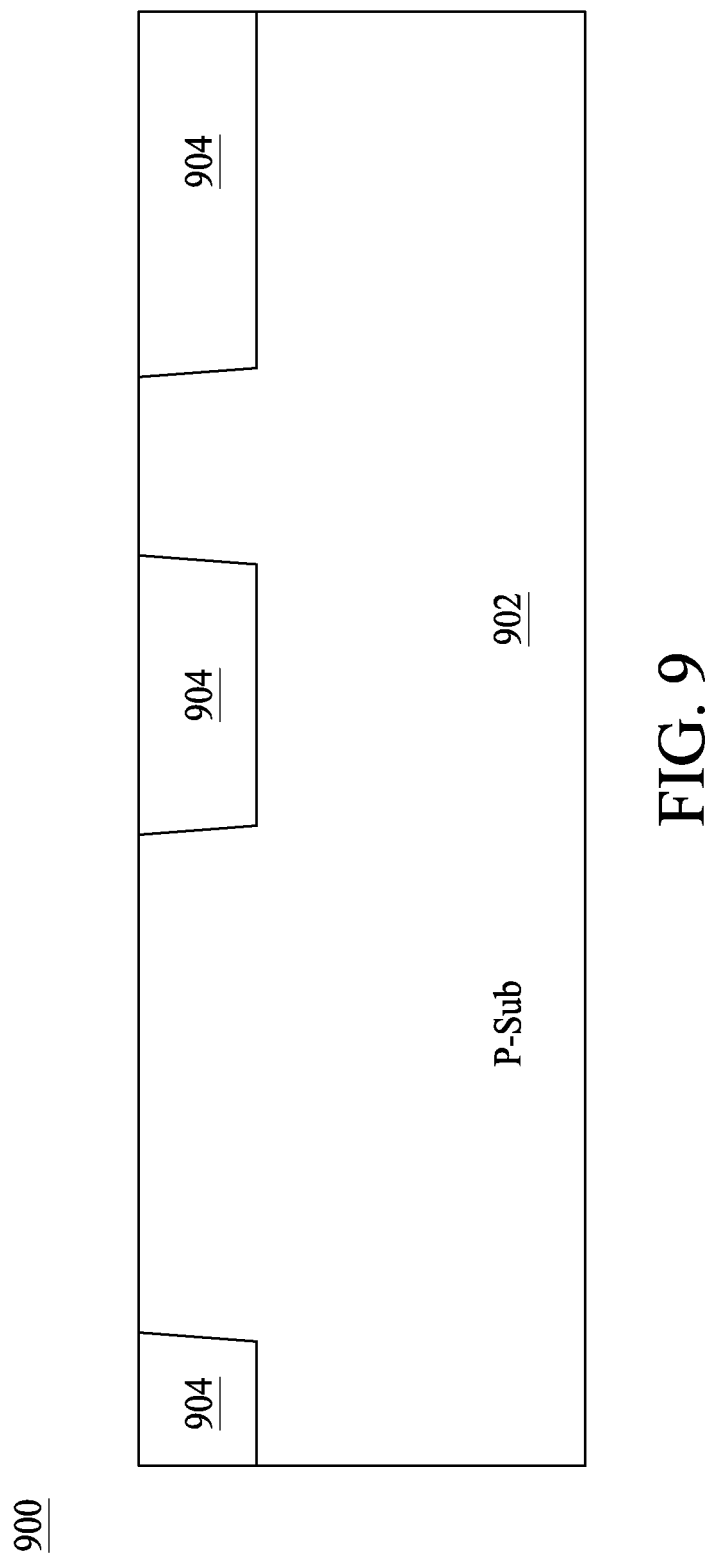
FIGS. 9-16C are cross-sectional diagrams illustrating a high voltage semiconductor device at various stages of fabrication according to another exemplary embodiment of the present disclosure.

Referring to FIG. 9, a semiconductor substrate 902 is provided. The substrate 902 may include a semiconductor wafer similar to the semiconductor substrate 202. Isolation feature structures 904 such as shallow trench isolations (STI) or local oxidation of silicon (LOCOS) including isolation features may be formed in the substrate 902 to define and electrically isolate various active regions similar to the isolation feature structures 204.

Figure 10:
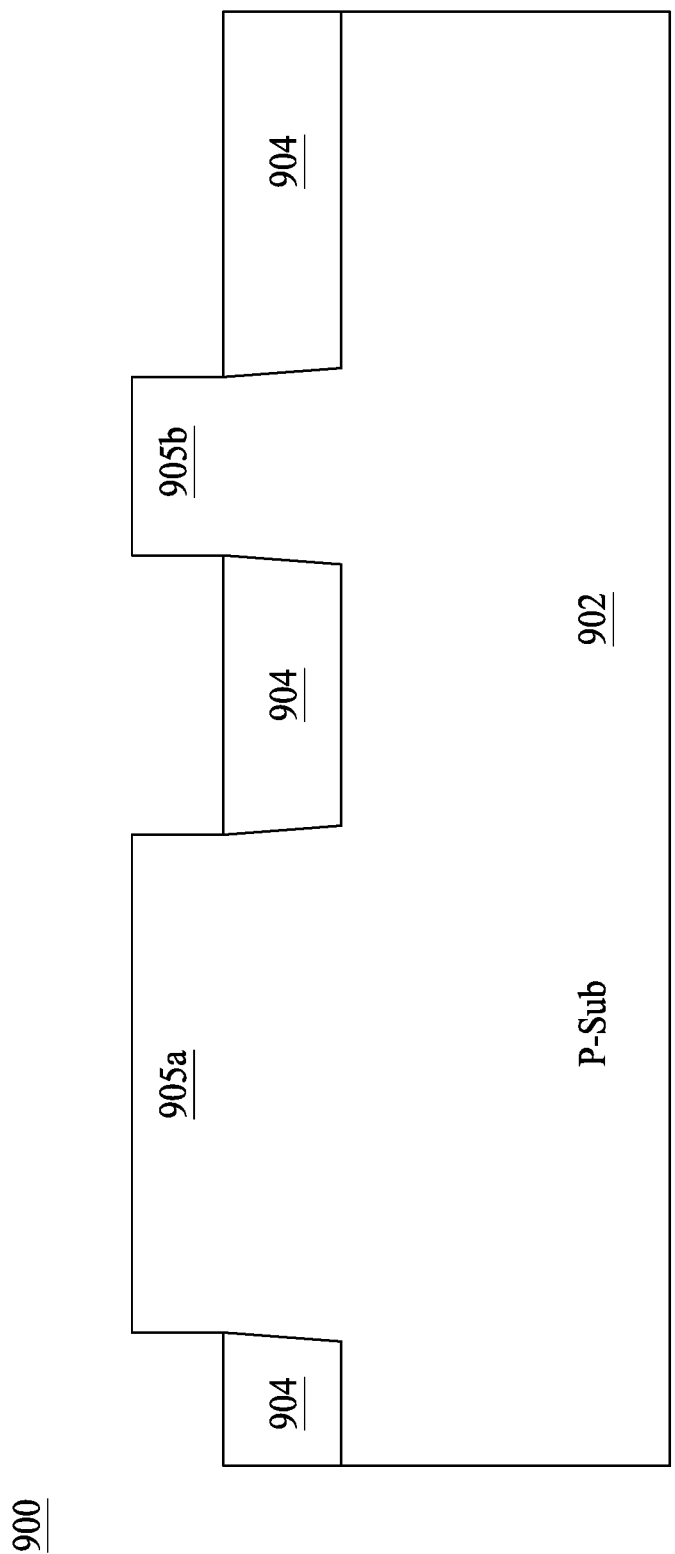

Referring to FIG. 10, semiconductor fins 905a and 905b are formed on the semiconductor substrate 202. The semiconductor fins 905a and 905b extend laterally between the isolation feature structures 904.

Figure 11:
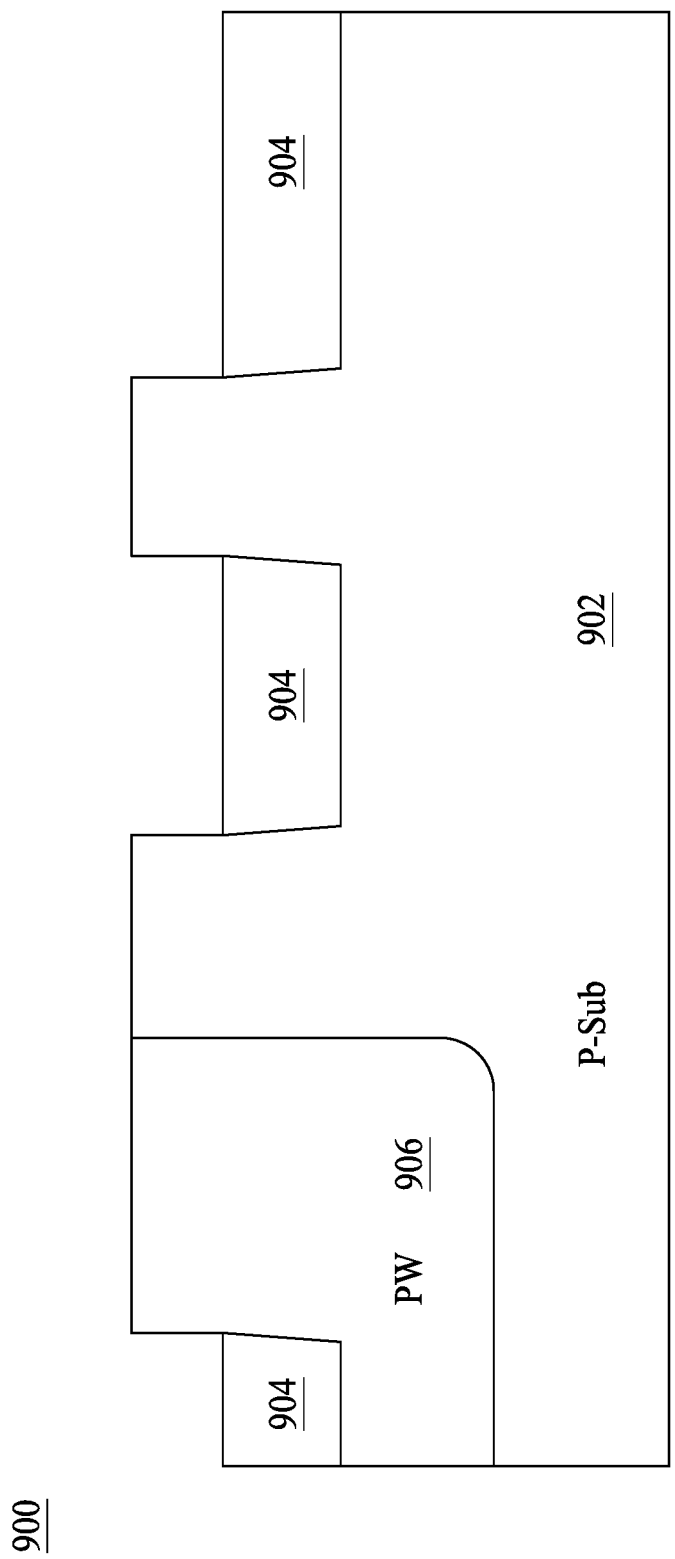

In FIG. 11, a P-well region (PW) 906 is formed in various regions of the P-substrate 902 and the semiconductor fin 905a by ion-implantation or diffusion techniques known in the art.

Figure 12:
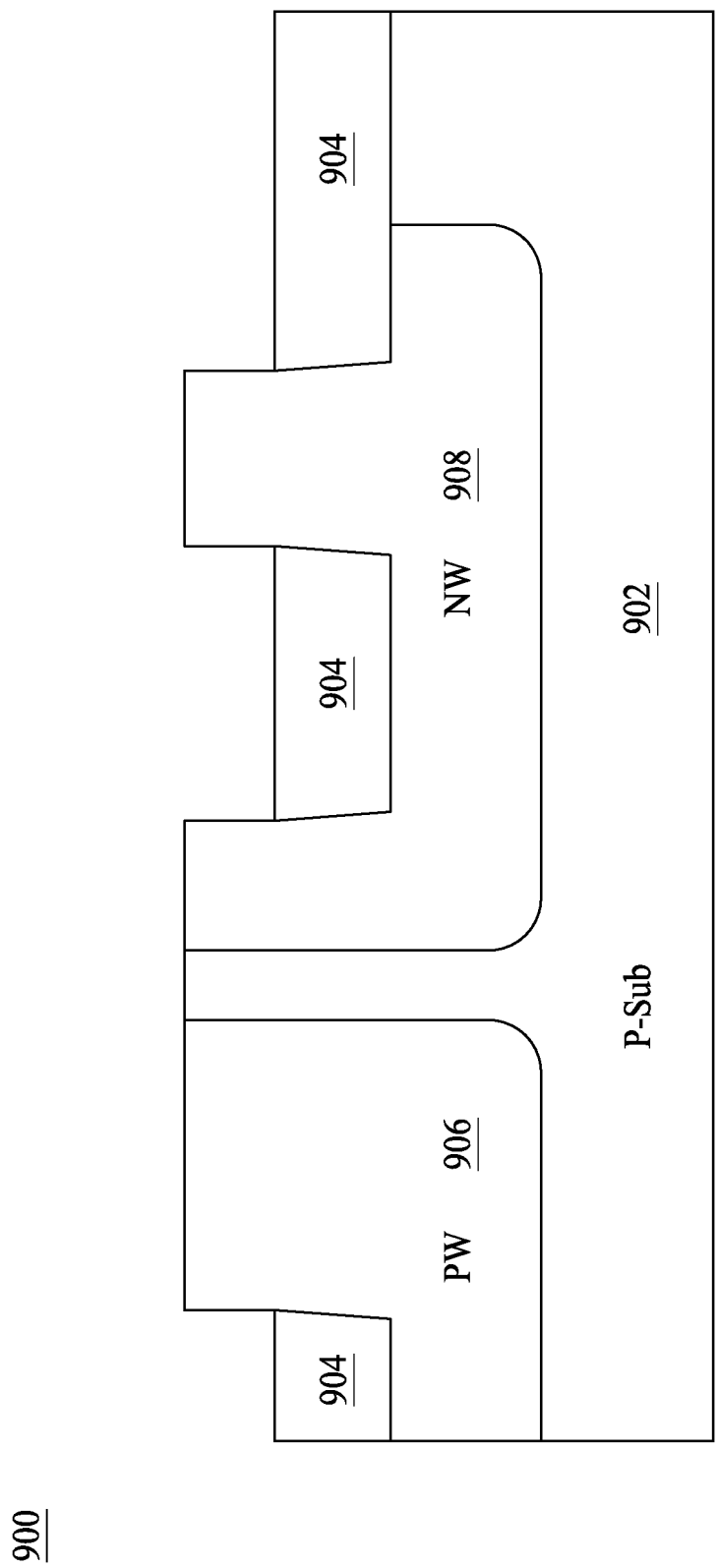

In FIG. 12, an N-well region (NW) 908 is formed in various regions of the P-substrate 902 and the semiconductor fins 905a and 905b by ion-implantation or diffusion techniques similar to forming the N-well region 208 and the P-well regions 206 and 906 as mentioned above.

Figure 13:
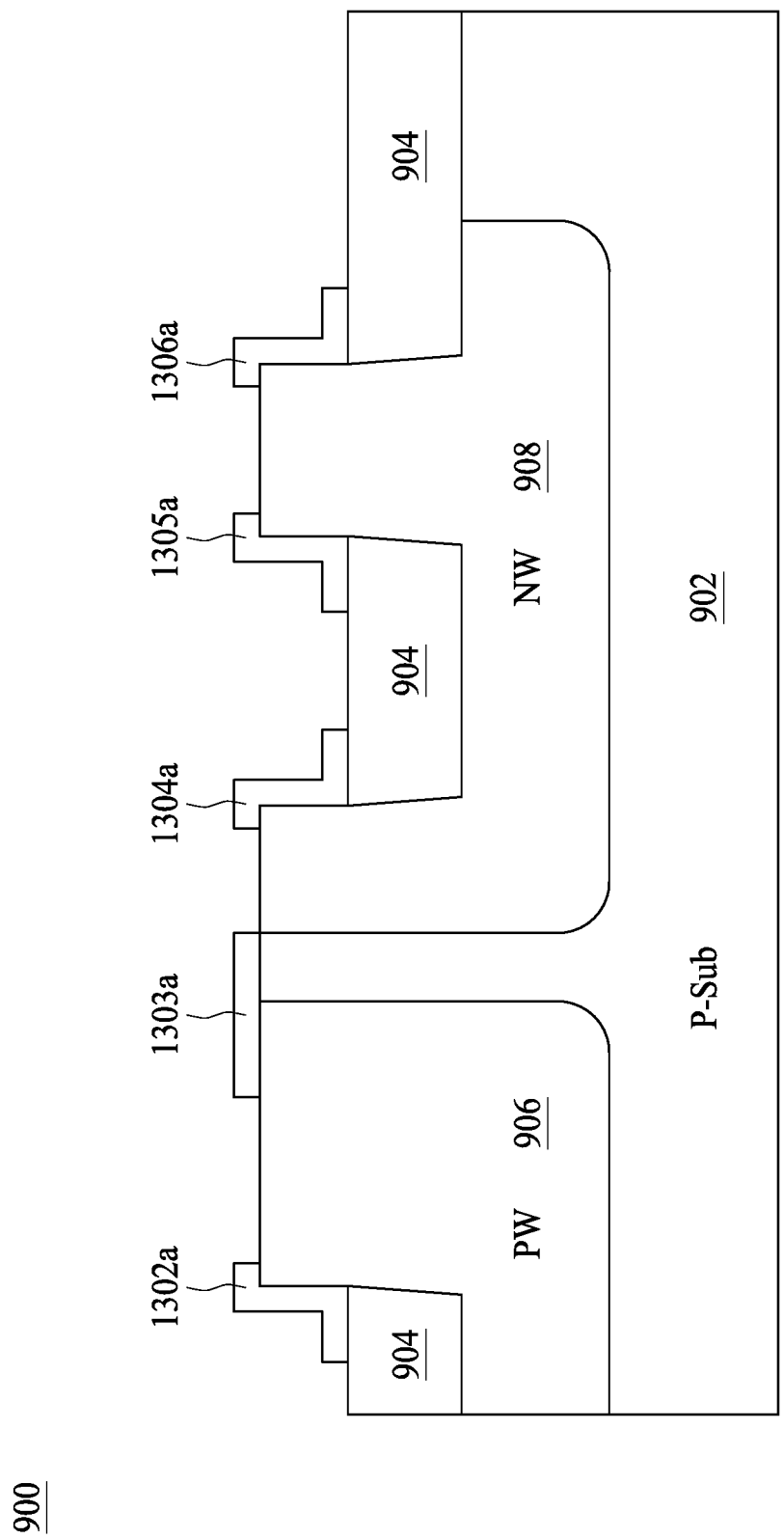

In FIG. 13, gate dielectric layers 1302a-1306a are formed and patterned on the semiconductor fins 905a and 905b. The gate dielectric layers 1302a-1306a may include a silicon oxide layer. Alternatively, the gate dielectric layers 1302a-1306a may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. Moreover, the gate dielectric layers 1302a-1306a may have a multilayer structure such as one layer of silicon oxide and another layer of high k material. Furthermore, the gate dielectric layers 1302a-1306a may be formed using chemical vapor deposition (CVD), physical vapor deposition (PVD), atomic layer deposition (ALD), thermal oxide, other suitable processes, or combinations thereof.

Figure 14:
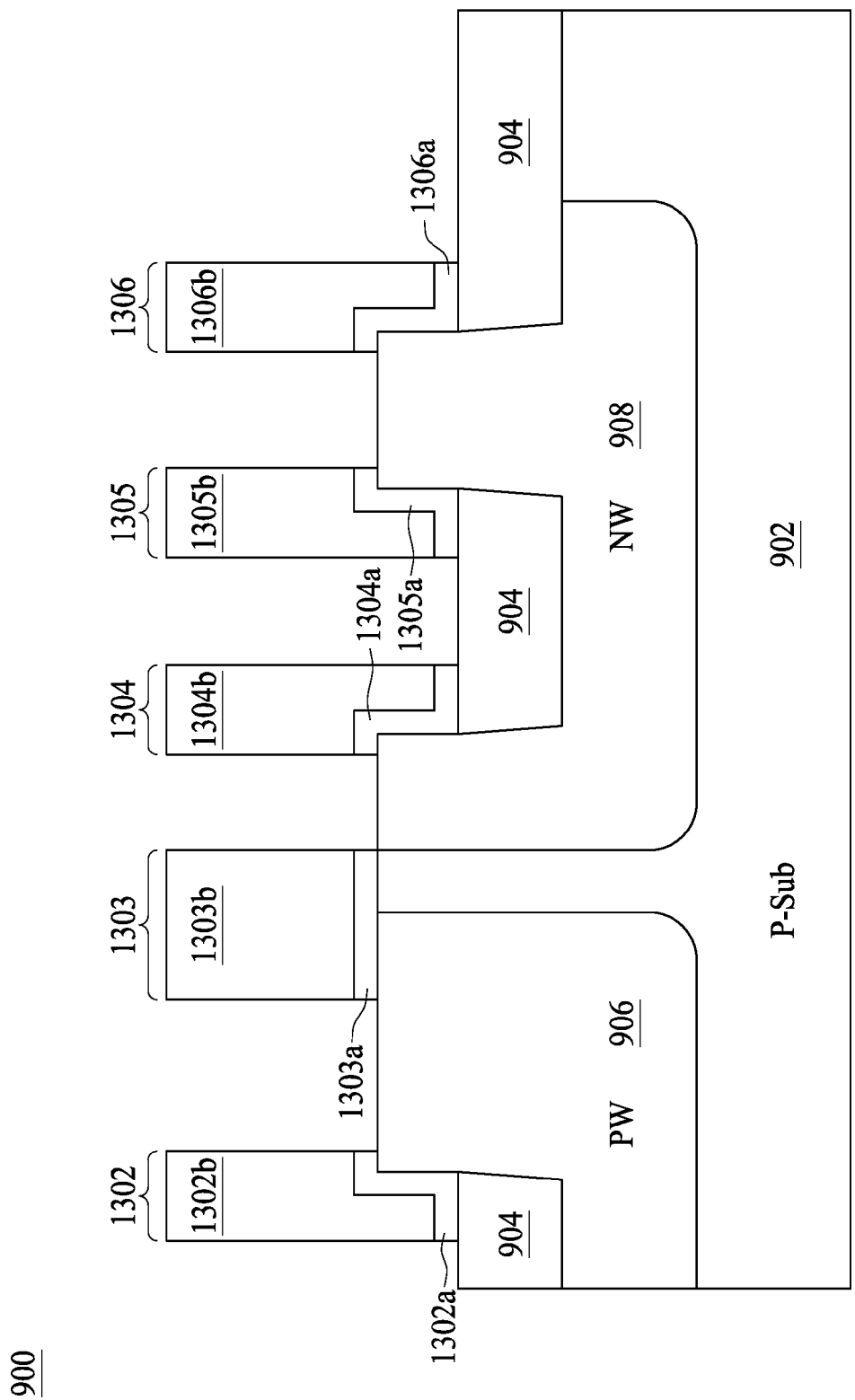

In FIG. 14, gate electrodes 1302b-1306b are formed on the gate dielectric layers 1302a-1306a, respectively. The gate electrodes 1302b-1306b may include a doped polycrystalline silicon (or polysilicon). Alternatively, the gate electrodes 1302b-1306b may include a metal such as Al, Cu, W, Ti, Ta, TiN, TaN, NiSi, CoSi, other suitable conductive materials, or combinations thereof. In addition, the gate electrodes 1302b-1306b may be formed by CVD, PVD, plating, and other proper processes. Also, the gate electrodes 1302b-1306b may have a multilayer structure and may be formed in a multi-step process using a combination of different processes. In the exemplary embodiment, the gate dielectric layer 1303a and the gate electrode 1303b together form an active gate structure 1303 on the semiconductor fin 905a.

Furthermore, the gate dielectric layer 1304a and the gate electrode 1304b together form a gate structure 1304 covering a sidewall of the semiconductor fin 905a. In particular, the gate structure 1304 may be disposed on the N-well region 908 and the isolation feature structures 904 adjacent to the active gate structure 1303, and may be used as a field plate to enhance device breakdown voltage similar to the gate structure 504 as mentioned above. Moreover, the gate dielectric layer 1302b and the gate electrode 1302a together form a gate structure 1302 covering another sidewall of the semiconductor fin 905a. In addition, the gate dielectric layer 1305b and the gate electrode 1305a together form a gate structure 1305 covering a sidewall of the semiconductor fin 905b, and the gate dielectric layer 1306b and the gate electrode 1306a together form a gate structure 1306 covering another sidewall of the semiconductor fin 905b. The gate structures 1302, 1305 and 1306 are regarded as dummy gate structures and may be comprised of non-metal materials different from the active gate structure 1303 and the field plate 1304. In some embodiments, the field plate 1304 may be coplanar with the active gate structure 1303 and the dummy gate structures 1302, 1305 and 1306. In some embodiments, the gate structures 1302, 1305 and 1306 may be eliminated.

The gate structures 1302-1306 may further include sidewall spacers (not shown). The sidewall spacers may be formed on both sides of the gate structures 1302-1305. The sidewall spacers may include a dielectric material such as silicon oxide. Alternatively, the sidewall spacers may optionally include silicon nitride, silicon carbide, silicon oxynitride, or combinations thereof. In some embodiments, the sidewall spacers may have a multilayer structure. The sidewall spacers may be formed by deposition and etching (anisotropic etching technique) as is known in the art.

Figure 15:
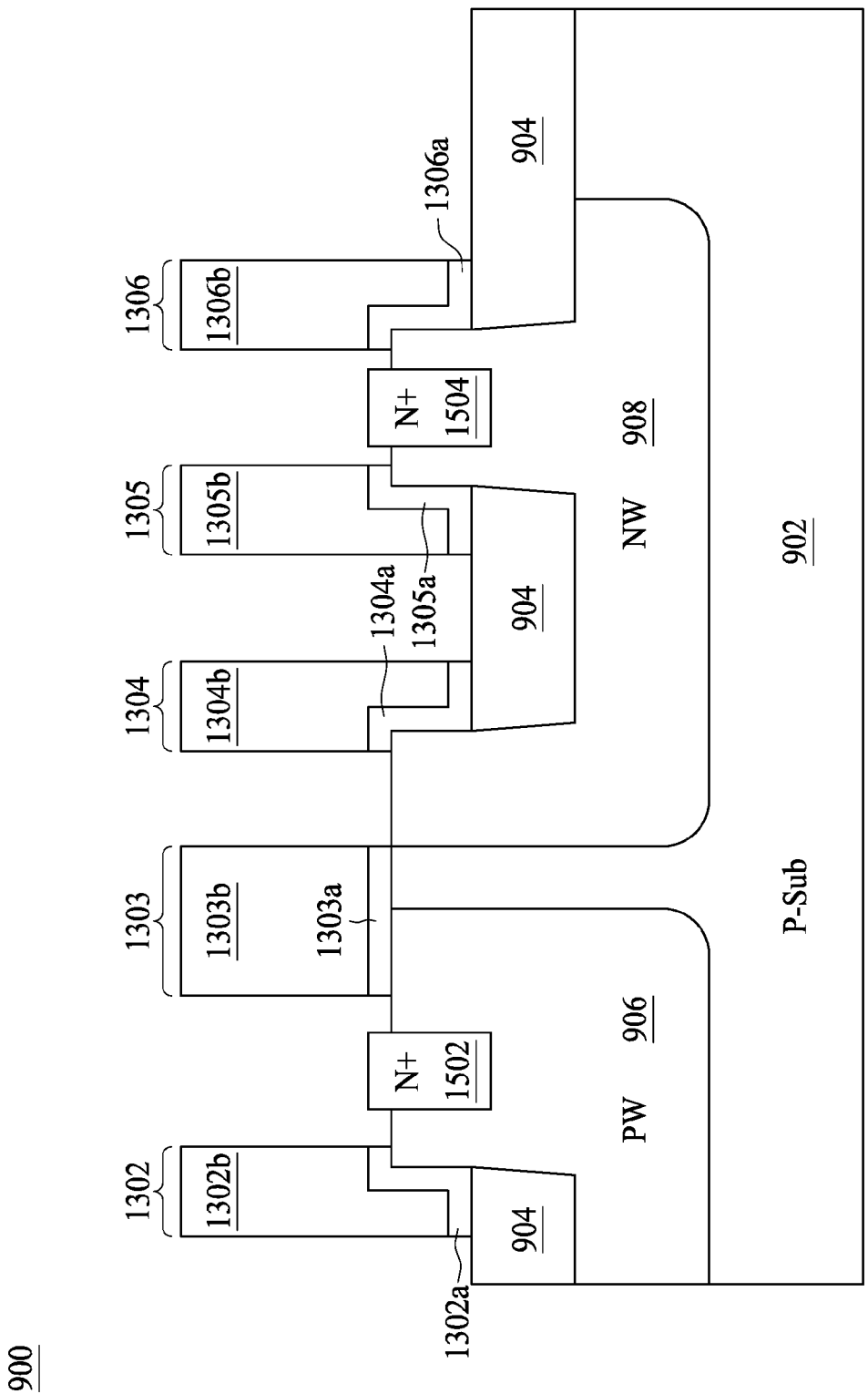

In FIG. 15, a source region 1502 is formed in the P-well 906 and a drain region 1504 is formed in the N-well 908, where the source region 1502 and drain region 1504 are n-type (referred to as N+ or heavily doped regions). The n-type source region 1502 and the n-type drain region 1504 may be positioned on both sides of the active gate structure 1303 and interposed thereby. In some embodiments, the source region 1502 may include an edge adjacent or substantially self-aligned to one of the sidewall spacers of the active gate structure 1303. The drain region 1504 may include an edge that is distanced from an outer edge of the other one of the sidewall spacers of the active gate structure 1303. In the present embodiment, the source region 1502 and the drain region 1504 include n-type dopants such as P or As. The source region 1502 and the drain region 1504 may be formed by a method such as ion implantation or diffusion or deposition. A rapid thermal annealing (RTA) process may be used to activate the implanted dopant. In various embodiments, the source region 702 and the drain region 704 may have different doping profiles formed by a multi-process implantation.

Figure 16A:
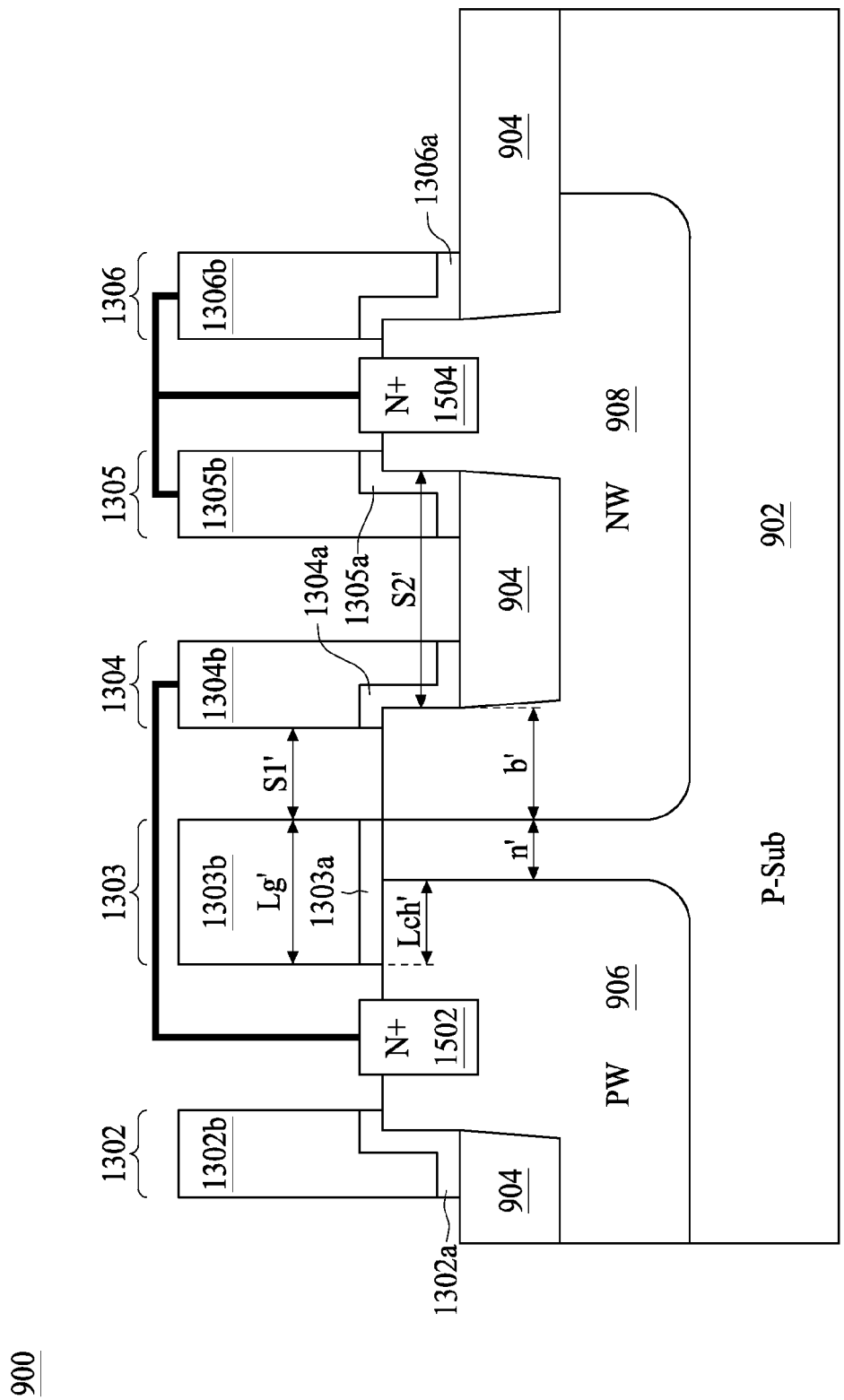
Figure 16B:
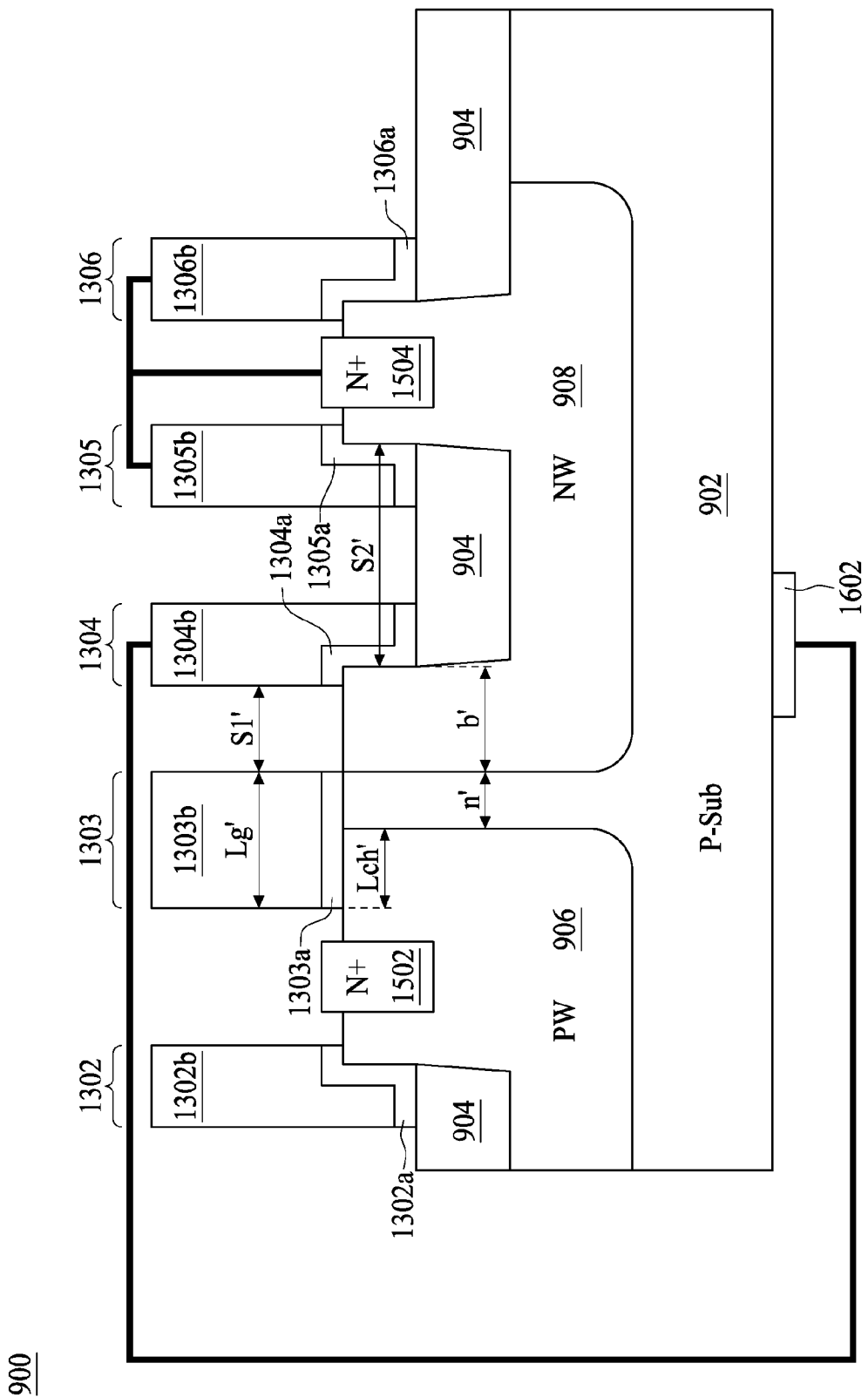

A plurality of patterned dielectric layers and conductive layers may then be formed over the substrate 902 similar to the high voltage n-type LDMOS FinFET device 100 in order to form multilayer interconnects configured to couple the various p-type and n-type doped regions in the substrate 902, such as the source region 1502, the drain region 1504, and the gate electrode 1303b. However, details regarding the multilayer interconnects are not depicted. The field plate 1304 may be coupled to the source region 1502, as can be seen in FIG. 16A, where the connection between the field plate 1304 and the source region 1502 is only schematically illustrated. In some embodiments, the field plate 1304 may be alternatively coupled to a bulk electrode 1602 of the semiconductor substrate body 902, as can be seen in FIG. 16B. The configurations of the field plate 1304 of FIGS. 16A and 16B can provide an electric field shielding capability to prevent high electric field induced device damage by the high voltage at the drain region 1504. A parasitic capacitance $C_{GD}$ between the active gate structure 1303 and the drain region 1304 can also be reduced, thereby increasing the operating bandwidth for high-switching frequency applications.

Figure 16C:
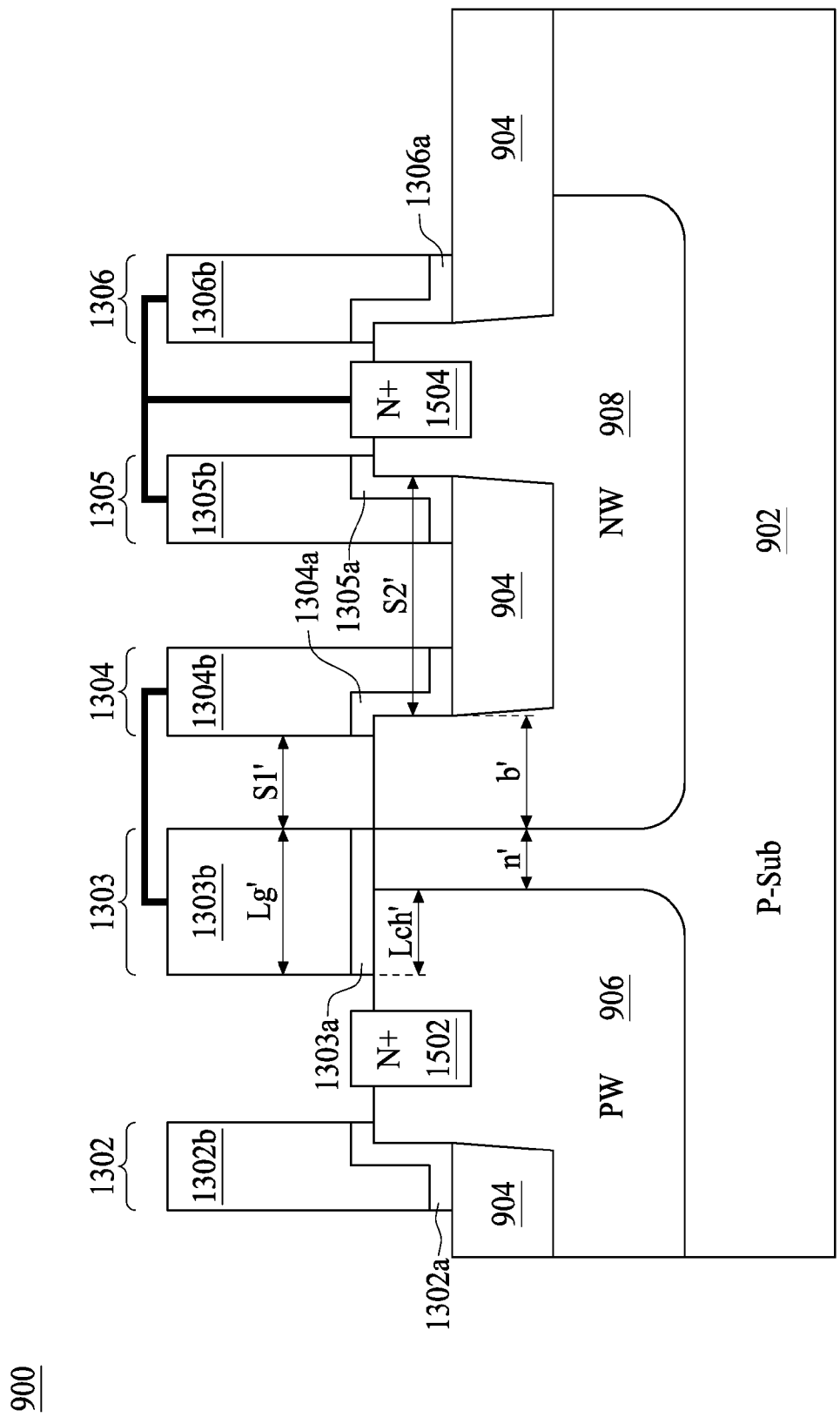

In some embodiments, the field plate 1304 may be coupled to the active gate structure 1303 in order to obtain a lower on-resistance $R_{dson}$, as shown in FIG. 16C. The dummy gate structures 1305 and 1306 may be coupled to the drain region 1504 and the dummy gate structure 1302 may be left floating, as shown in FIGS. 16A-16C. However, this is not a limitation of the present disclosure. In some embodiments, the dummy gate structure 1305 and/or the dummy gate structure 1306 may be left floating. In some embodiments, the dummy gate structure 1302 may be coupled to the source region 1502. In some embodiments, the dummy gate structure 1302 may be coupled to the bulk electrode 1602 of the semiconductor substrate body 902.

A distance S1', not zero, between the active gate structure 1303 and the field plate 1304 may be as small as possible. For example, the distance S1' may be about 80 nm. However, this is not a limitation of the present disclosure. In some embodiments, the distance S1' may range from about 0 to about 200 nm. In some embodiments, the distance S1' may range from about 0 to about 1 um. In some embodiments, the N-well region 908 may be substantially self-aligned to the active gate structure 1303 at one end. However, in some embodiments, the N-well region 908 may at least partially overlap the active gate structure 1303 at one end. In some embodiments, a gate length Lg' may be greater than or equal to an overlap Lch' between the P-well region 906 and the active gate structure 1303. For example, the gate length Lg' may be about 240 nm, and the overlap Lch' may be about 135 nm. Furthermore, a distance n' between the N-well region 908 and the P-well region 906 may be about 105 nm. However, this is not a limitation of the present disclosure. In some embodiments, the gate length Lg' may range from about 1 nm to about 500 nm, and the overlap Lch' may range from about 1 nm to about 500 nm. The distance n' between the N-well region 908 and the P-well region 906 may range from about 0 to about 500 nm. In some embodiments, a distance b' between a left edge of the N-well region 908 and the isolation feature structures 904 in the N-well region 908 may be about 200 nm, and a width S2' of the isolation feature structures 904 in the N-well region 908 may be 200 nm. In some embodiments, the distance b' may range from about 1 nm to about 1 um, and the distance S2' may range from about 1 nm to about 1 um.

The process of forming the disclosed field plate structure may be combined with the formation process of gates structures (including active gates and dummy gates) of a standard HV process. Accordingly, there is no additional mask required particularly for the formation of the field plate structure. By appropriately coupling the field plate structure to a source region or a bulk electrode, the gate charge can be effectively reduced in an on-state operation, and a reduced parasitic capacitance between an active gate structure and a drain region can be obtained in both of the on and off-states. Moreover, by alternatively coupling the field plate structure to an active gate structure, a lower on-resistance can then be obtained.

Embodiments of the present disclosure provide a semiconductor structure. The semiconductor structure includes a substrate, a gate structure formed over the substrate, a source region and a drain region formed in the substrate on either side of the gate structure, the source region and the drain region both having a first type of conductivity, and a field plate formed over the substrate between the gate structure and the drain region, wherein the field plate is coupled to the source region or a bulk electrode of the substrate.

Some embodiments of the present disclosure provide a semiconductor structure. The semiconductor structure includes a substrate, a gate structure formed over the substrate, a source region and a drain region formed in the substrate on either side of the gate structure, and a field plate formed over the substrate between the gate structure and the drain region, wherein a distance between the gate structure and the field plate is in a range from about 0 to about 200 nm.

Embodiments of the present disclosure also provide a method for fabricating a semiconductor structure. The method includes providing a substrate, forming a gate structure over the substrate, forming a field plate at least partially over the substrate; forming a source region and a drain region in the substrate on either side of the gate structure, and coupling the field plate to the source region or a bulk electrode of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate having a semiconductor fin formed thereon;
   an active gate structure formed over the substrate;
   a source region and a drain region formed in the substrate on either side of the active gate structure, the source region and the drain region both having a first type of conductivity;
   a gate structure formed over the substrate between the active gate structure and the drain region;
   a well region in the substrate, the well region having the first type of conductivity and being self-aligned to an edge of the active gate structure;
   a gate dielectric on and at an edge of the semiconductor fin; and
   a dummy gate directly on the gate dielectric on and at the edge of the semiconductor fin;
   wherein the drain region is disposed in the well region, and the gate structure is electrically coupled to the source region via an interconnect.

2. The semiconductor structure of claim 1, wherein the active gate structure is formed over the semiconductor fin.

3. The semiconductor structure of claim 1, wherein a distance between the active gate structure and the gate structure is in a range from about 0 to about 200 nm.

4. The semiconductor structure of claim 1, wherein the gate structure includes a doped polycrystalline silicon (or polysilicon).

5. The semiconductor structure of claim 1, wherein the gate structure includes a metal.

6. The semiconductor structure of claim 1, wherein an isolation feature structure is formed between the active gate structure and the drain region.

7. The semiconductor structure of claim 1, wherein the semiconductor structure is a high voltage device.

8. A semiconductor structure, comprising:
   a substrate having a semiconductor fin formed thereon;
   an active gate structure formed over the substrate;
   a source region and a drain region formed in the substrate on either side of the active gate structure;
   a gate structure formed over the substrate between the active gate structure and the drain region;
   a gate dielectric on and at an edge of the semiconductor fin; and a dummy gate structure electrically coupled to the drain region via an interconnect, the dummy gate structure being coplanar with the gate structure, and the dummy gate structure being directly on the gate dielectric on and at the edge of the semiconductor fin.

9. The semiconductor structure of claim 8, wherein the active gate structure is formed over the semiconductor fin.

10. The semiconductor structure of claim 8, wherein the gate structure is coupled to a bulk electrode of the substrate.

11. The semiconductor structure of claim 8, wherein the gate structure is coupled to the active gate structure.

12. The semiconductor structure of claim 8, wherein the gate structure includes a doped polycrystalline silicon (or polysilicon).

13. The semiconductor structure of claim 8, wherein the gate structure includes a metal.

14. The semiconductor structure of claim 8, wherein the gate structure is coplanar with the active gate structure.

15. A semiconductor structure, comprising:
a substrate having a semiconductor fin formed thereon;
an active gate structure formed over the substrate;
a source region and a drain region formed in the substrate on either side of the active gate structure, the source region and the drain region both having a first type of conductivity;
a gate structure formed over the substrate between the active gate structure and the drain region;
a well region in the substrate, the well region having the first type of conductivity and being self-aligned to an edge of the active gate structure;
a gate dielectric on and at an edge of the semiconductor fin; and
a dummy gate directly on the gate dielectric on and at the edge of the semiconductor fin;
wherein the drain region is disposed in the well region, and the gate structure is distanced from the active gate structure and the drain region, and the gate structure is electrically coupled to the active gate structure via an interconnect.

16. The semiconductor structure of claim 15, wherein the active gate structure is formed over the semiconductor fin.

17. The semiconductor structure of claim 15, wherein a distance between the active gate structure and the gate structure is in a range from about 0 to about 200 nm.

18. The semiconductor structure of claim 15, wherein the gate structure includes a doped polycrystalline silicon (or polysilicon).

19. The semiconductor structure of claim 15, wherein the gate structure includes a metal.

20. The semiconductor structure of claim 15, wherein an isolation feature structure is formed between the active gate structure and the drain region.

* * * * *